(12) United States Patent
Gupta et al.

(10) Patent No.: US 9,729,165 B2
(45) Date of Patent: Aug. 8, 2017

(54) DELTA-SIGMA ANALOG-TO-DIGITAL CONVERTER TOPOLOGY WITH IMPROVED DISTORTION PERFORMANCE

(71) Applicant: Texas Instruments Incorporated, Dallas, TX (US)

(72) Inventors: Amit K. Gupta, Richardson, TX (US); Peng Cao, Richardson, TX (US); Venkatesh Acharya, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 15/153,384

(22) Filed: May 12, 2016

(65) Prior Publication Data

US 2016/0336956 A1 Nov. 17, 2016

Related U.S. Application Data

(60) Provisional application No. 62/273,755, filed on Dec. 31, 2015, provisional application No. 62/160,450, filed on May 12, 2015.

(51) Int. Cl.
*H03M 1/06* (2006.01)
*H03M 3/00* (2006.01)

(52) U.S. Cl.
CPC ........... *H03M 3/376* (2013.01); *H03M 3/344* (2013.01); *H03M 3/422* (2013.01); *H03M 3/452* (2013.01)

(58) Field of Classification Search
CPC ........ H03M 3/45; H03M 3/452; H03M 3/454; H03M 3/456; H03M 3/322; H03M 3/422; H03M 3/464
USPC .................................................. 341/143, 118
See application file for complete search history.

(56) References Cited

U.S. PATENT DOCUMENTS

| | | | |
|---|---|---|---|
| 7,583,215 B2 * | 9/2009 | Yamamoto | H03M 3/406 341/143 |
| 8,779,957 B2 * | 7/2014 | Rajaee | H03M 3/452 341/143 |
| 2015/0171888 A1 * | 6/2015 | Breems | H03M 3/368 341/143 |

* cited by examiner

*Primary Examiner* — Khai M Nguyen
(74) *Attorney, Agent, or Firm* — Goutham Kondapalli; Charles A. Brill; Frank D. Cimino

(57) ABSTRACT

A delta-sigma Analog-to-Digital Converter (ADC) (IC) which includes an input feed-forward path extending from an input to the ADC to a feed-forward summing circuit disposed between a loop filter and quantizer of the ADC, and a filter disposed in the feed-forward path as an apparatus for improving distortion performance in the delta-sigma ADC. The filter may be a low pass filter, for example, a Resistor-Capacitor (RC) circuit. The filter may have a cut-off frequency outside the ADC's passband. The filtering provided may be continuous-time filtering, even if the delta-sigma ADC is a discrete-time delta-sigma ADC.

11 Claims, 2 Drawing Sheets

DELTA-SIGMA ANALOG-TO-DIGITAL CONVERTER TOPOLOGY WITH IMPROVED DISTORTION PERFORMANCE

CROSS-REFERENCE TO RELATED APPLICATION

This application claims the benefit of U.S. Provisional Application No. 62/273,755, filed Dec. 31, 2015, and of U.S. Provisional Application No. 62/160,450, filed May 12, 2015, the disclosures of which are incorporated herein by reference in their entirety.

BACKGROUND

There are multiple architectures or topologies for Delta-Sigma Analog-to-Digital Converters (ADCs). One such architecture uses an input feed-forward path to minimize swings on integrator outputs. In such topologies a feed-forward path feeds an ADC input to the quantizer, which is typically a so-called "sub-ADC." This sub-ADC is typically a comparator in a single bit ADC and in a multi-bit ADC it is a flash ADC, or the like, having a number of comparators, by way of example sixteen comparators for a four bit quantizer.

FIG. 1 is a block schematic showing example prior art input feed-forward delta-sigma ADC 100. Therein, analog continuous-time voltage U(s) is fed forward to feed-forward summing circuit 102, via feed-forward path 104. Analog voltage U(s) is sampled at feed-forward sampling network 106 and delivered as a sampled discrete voltage U'(z) to so-called sub-ADC 108 (a quantizer). Analog input voltage U(s) is separately sampled by ADC sampling network 110. Feed-forward sampling network 106, ADC sampling network 110, and the like, are illustrated herein employing a switch symbol for the sake of conciseness. However, such sampling networks may include a number of components and in discrete-time input feed-forward delta-sigma ADCs may be switched-capacitor sampling circuit or networks, or the like. Regardless, sampled voltage U(z) and output of so-called sub-Digital-to-Analog Converter (sub-DAC) 112 are differentiated in ADC delta circuit 114, providing a discrete-time analog voltage at the input of discrete-time loop filter H(z) 116. The loop filter is typically a cascade of integrators with the number of integrators determining the loop order. The output voltage of discrete-time loop filter 116 is added with the sampled input signal U'(z) by summing circuit 102. Depending on the resulting voltage, the output of sub-ADC quantizer 108 is changed. Sub-DAC 112 responds on the next clock phase by changing its analog output voltage, causing discrete-time loop filter 116 to progress in the opposite direction and forcing the value of ADC digital output Y(z), to track the average value of the input U(s).

Advantageously, in such an input feed-forward topology for delta-sigma ADC, the integrators in the discrete-time loop filter 116, exhibit low voltage swings at their outputs. However, because sub-ADC 108 is directly sampling the input there is kickback (118) from the quantizer to the input U(s). Since the driving circuit generating signal U(s) has finite bandwidth and nonzero output impedance the disturbance caused by this kickback may not settle in one clock cycle. This leads to distortion of the signal being sampled by the input sampling circuit 110. Therefore, in such a delta-sigma ADC architecture with input feed-forward path, this kickback from quantizer 108 limits the distortion performance of ADC 100.

SUMMARY

Embodiments of the present disclosure for improving distortion performance in a delta-sigma Analog-to-Digital Converter (ADC), which may be at least a part of an Integrated Circuit (IC), may include filtering an input to a feed-forward path, such as may extend from an input of the delta-sigma ADC to a feed-forward summing circuit disposed between the loop filter and a quantizer of a delta-sigma ADC.

Hence, an apparatus for improving distortion performance in a delta-sigma ADC (device) might comprise a filter disposed in an input feed-forward path of the delta-sigma ADC. The filter may be a low pass filter, for example, a Resistor-Capacitor (RC) circuit. Regardless, the filter has a cut-off frequency outside the passband of the ADC. The filtering provided may be continuous-time filtering, even if the delta-sigma ADC is a discrete-time delta-sigma ADC.

BRIEF DESCRIPTION OF THE DRAWINGS

Figure 1:
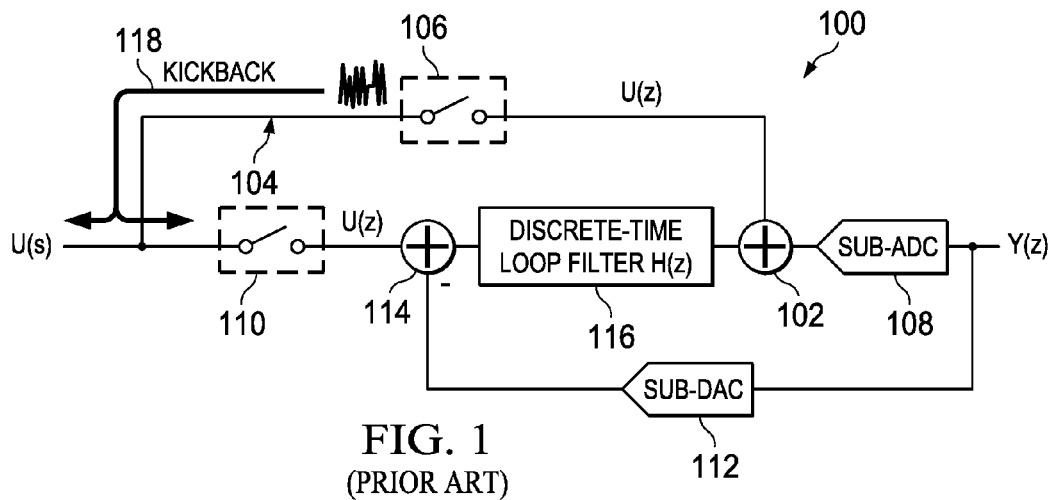
Figure 2:
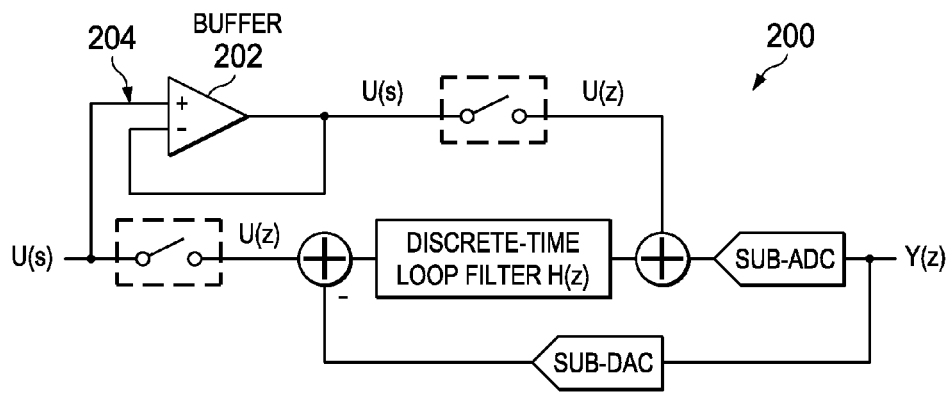
Figure 3:
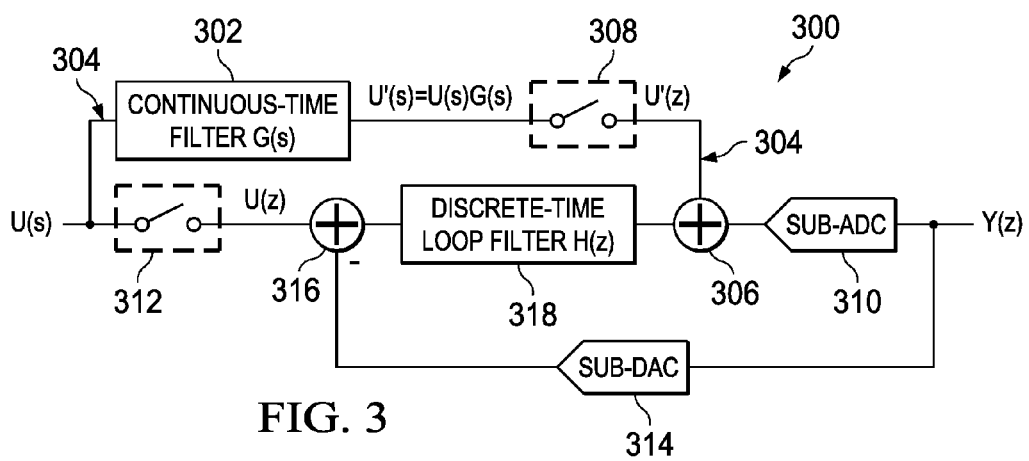

Having thus described the present systems and methods in general terms, reference will now be made to the accompanying drawings, wherein:

FIG. 1 is a block schematic showing an example prior art input feed-forward delta-sigma Analog-to-Digital Converter (ADC);

FIG. 2 is a block schematic showing an example input feed-forward delta-sigma ADC with a buffer disposed in the input feed-forward path, in accordance with some embodiments;

FIG. 3 is a block schematic showing an example delta-sigma ADC, in which a filter is disposed in the input feed-forward path, in accordance with some embodiments.

Figure 4:
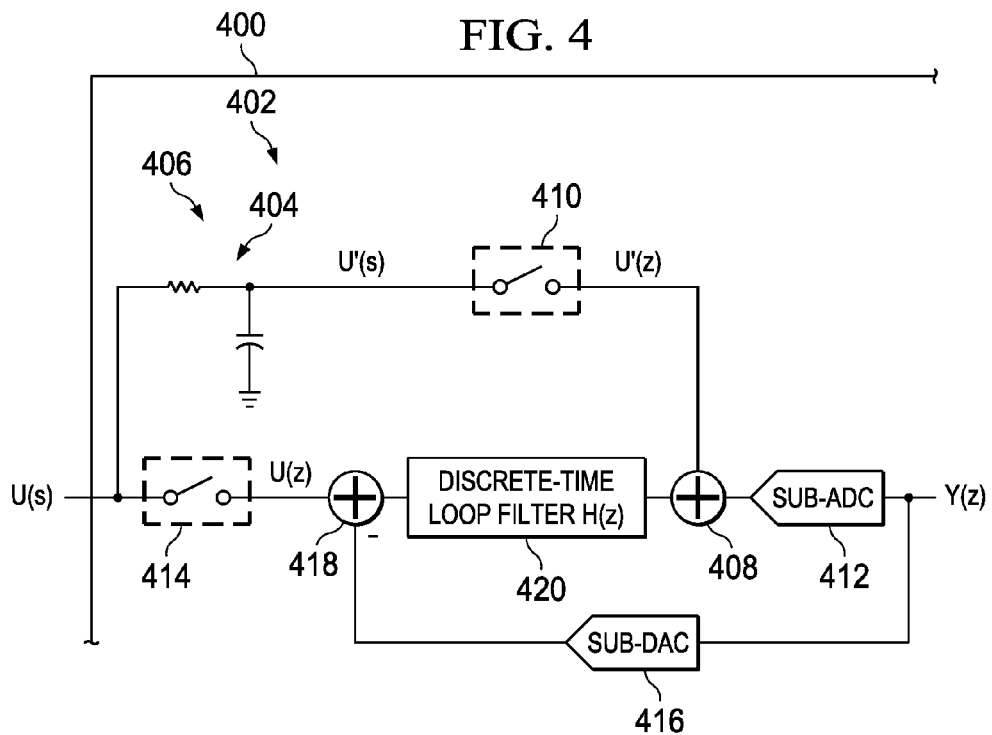
Figure 5:
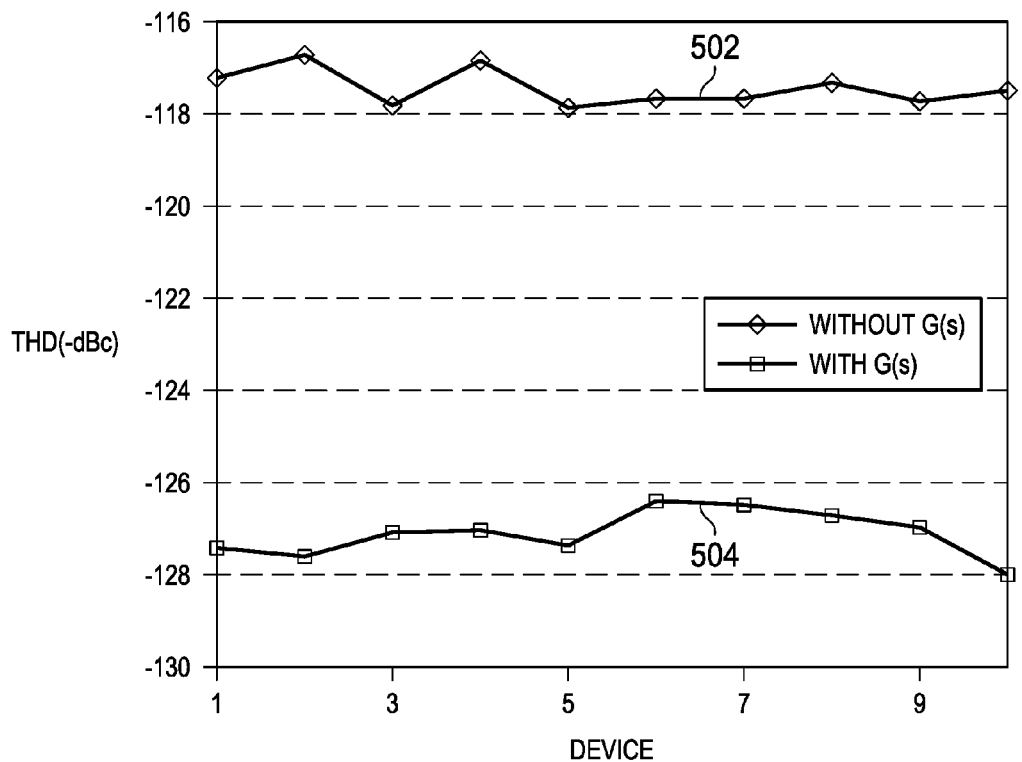

FIG. 4 is block schematic showing device, in which example discrete-time feed-forward delta-sigma ADC is shown in greater detail, in accordance with some embodiments; and FIG. 5 is a graph of typical Total Harmonic Distortion (THD) performance at the output of example input feed-forward delta-sigma ADC devices, compared to a graph of THD output of example input feed-forward delta-sigma ADC devices employing a feed-forward input filter in accordance with some embodiments of the present systems and methods.

DETAILED DESCRIPTION

The techniques of this disclosure now will be described more fully hereinafter with reference to the accompanying drawings. These techniques may, however, be embodied in many different forms and should not be construed as limited to the embodiments set forth herein. Rather, these embodiments are provided so that this disclosure will be thorough and complete, and will fully convey the scope of this disclosure to those skilled in the art. One skilled in the art may be able to use the various embodiments described herein.

For example, while this disclosure may describe the present systems and methods referring to one specific type of delta-sigma Analog-to-Digital Converters (ADCs) (i.e. discrete-time ADCs) the present systems and methods are not limited to this type of ADC or ADC modulators. For example, embodiments of the present systems and methods may also be implemented in continuous-time feed-forward delta-sigma ADCs or ADC modulators. Further, while the present systems and methods are described herein with reference to ADCs, it should be appreciated that as discussed herein such discussed ADCs and ADC modulators may be considered one and the same.

While input feed-forward delta-sigma ADCs have the advantage of there being no signal content at any of the ADC integrator outputs, leading to smaller voltage swings, which may then allow linearity requirements for the the integrators to be relaxed, the kickback from the input feed-forward branch can limit distortion performance in such ADCs.

The present systems and methods isolate the delta-sigma ADC input from the quantizer. One proposed means to do so may involve inserting a buffer in the input branch. FIG. 2 is a block schematic showing example feed-forward delta-sigma ADC 200 with buffer 202 disposed in feed-forward path 204, in accordance with some embodiments. However, buffer 202 may require an operational amplifier (opamp) which is typically costly with respect to power consumption and circuit area (Integrated Circuit (IC) silicon area), especially in high-speed ADC designs.

However, in accordance with the present systems and methods the feed-forward delta-sigma ADC quantizer may be isolated from ADC input, and hence the ADC input sampling circuitry or ADC driver circuitry, using a filter. Thus, an implementation for improving distortion performance in a delta-sigma ADC with input feed-forward topology includes filtering input to (e.g. in) a feed-forward path (e.g. in the feed-forward path).

A resulting delta-sigma ADC (IC) may have a hybrid topology with an input feed-forward filter which is continuous-time and all other circuits operating in discrete-time. This leads to the ADC transfer function, which is no longer independent of ADC clock frequency.

FIG. 3 is a block schematic showing example input feed-forward delta-sigma ADC 300, in which filter 302 is disposed in feed-forward path 304, in accordance with some embodiments. Filter 302 may be a passive filter, such as a (first order) passive (low pass) Resistor-Capacitor (RC) (and/or a (second order) passive RC circuit). As such, an opamp, or the like, is not required, as in implementation 200 of buffer 202 to isolate the quantizer from the input. Hence, a delta-sigma ADC employing input feed-forward path filter 302, such as in accordance with the illustrated example 300, may require significantly less circuit area and requires significantly less power, than buffer 202 employed in proposed solution 200, while still providing improved distortion performance.

Thus, in input feed-forward delta-sigma ADC 300 analog voltage U(s), an un-sampled analog signal, is fed forward to feed-forward summing circuit 306, via feed-forward path 304. Analog voltage U(s) is filtered at continuous-time filter 302 to provide filtered signal U'(s), which may be considered equal to U(s)G(s), which in turn, is sampled at feed-forward sampling network 308 to provide filtered and sampled signal U'(z), a sampled analog input, and hence a discrete-time signal, which is delivered to quantizer 310, via summing circuit 306.

Analog input voltage U(s) is separately sampled by ADC sampling network 312 to provide sampled voltage U(z), a sampled analog input, and hence a discrete-time signal. U(z) and the output of sub-Digital-to-Analog Converter (sub-DAC) 314 are differentiated in ADC delta circuit 316, providing an analog voltage at the input of discrete-time loop filter H(z) 318. Discrete-time loop filter 318 may include one or more integrators, in accordance with various discrete-time delta-sigma ADC architectures.

The output voltage of discrete-time loop filter 318 is combined with the filtered sampled input signal U'(z) by summing circuit 306. Depending on the resulting voltage, the output of quantizer 310 is changed. Sub-DAC 314 responds on the next clock phase by changing its analog output voltage, causing discrete-time loop filter 316 to progress in the opposite direction and forcing the value of ADC digital output Y(z), to track the average value of the input U(s).

Because (continuous-time) filter 302 G(s) is inserted in input feed-forward path 304 kickback from quantizer 310 is reduced, particularly kickback created by input feed-forward path sampling network 308 is minimized, minimizing impact on ADC input sampling circuit 312 and/or driver, or the like, providing analog input U(s).

FIG. 4 is block schematic showing device 400, in which example discrete-time feed-forward delta-sigma ADC 402 is shown in greater detail, in accordance with some embodiments. Therein (as with FIG. 3) a "single-ended" implementation is shown, however the present delta-sigma ADC topology for improved distortion performance may be fully differential. For example, each block in ADC 402 may have a pair of two inputs and a pair of two outputs, only the difference between each pair should affect the result, with the average value, which is common-mode signal, being rejected. Any such ADC may employ the present systems and methods for improved distortion performance.

The feed-forward path filter 404 disposed in input feed-forward path 406 may be a passive filter, such as the illustrated first order passive low pass RC circuit. In discrete-time input feed-forward delta-sigma ADC 402 analog voltage U(s), an un-sampled analog signal is fed forward to feed-forward summing circuit 408, via feed-forward path 406. Analog voltage U(s) is filtered at continuous-time passive filter 404 to provide filtered signal U'(s), which may be considered equal to U(s)G(s), which is, in turn, sampled at feed-forward (switched-capacitor) sampling network 410 to provide filtered and sampled signal U'(z), a sampled analog input, and hence a discrete-time signal, which is delivered to sub-ADC quantizer 412, via summing circuit 408.

Analog input voltage U(s) is separately sampled by ADC (switched-capacitor) sampling network 414 to provide sampled voltage U(z), a sampled analog input, and hence a discrete-time signal. U(z) and output of sub-DAC 416 are differentiated in ADC delta circuit 418, providing an analog voltage at the input of discrete-time loop filter 420. The number of integrators making up discrete-time loop filter 420, or the like may define the "order" of the ADC. For example, a second order ADC may have two integrators, third order ADC may have three integrators etc.

The output voltage of discrete-time loop filter 420 is combined with the filtered sampled input signal U'(z) by summing circuit 408. Again, the output of sub-ADC quantizer 412 may be changed, dependent on the resulting voltage. Sub-DAC 416 responds on the next clock phase by changing its analog output voltage, causing discrete-time loop filter 418 to progress in the opposite direction and forcing the value of the ADC digital output Y(z) (such as to an ADC decimation filter), to track the average value of the input U(s).

Again, because of passive continuous-time RC filter 404 in input feed-forward path 406, kickback from quantizer 412 is reduced, particularly kickback created by (switched-capacitor) feed-forward path sampling network 410, minimizing impact on ADC (switched-capacitor) input sampling circuit 414 and/or a driver circuitry, or the like, providing analog input U(s).

As noted, filter 302 or 404 may be a continuous-time filter, in that it operates at all times, regardless of the sampling state of the analog signal. That is, although ADC 300 or 402 may be discrete-time (switched-capacitor), wherein all transfer functions are in the "z" (discrete-time or sampled) domain, the filter may be implemented in the "s" (continuous-time) domain. Thus, in such examples, the filter transfer function is in the s-domain, and the rest of the ADC operates in the z-domain. However, embodiments of the present systems and methods may be implemented in continuous-time feed-forward delta-sigma ADCs, wherein both the feed-forward filter and the ADC operating the s-domain.

As noted, continuous-time filter 302 G(s) or 404 may take the form of a low-pass RC filter circuit. Such a low pass filter passes signals with a frequency lower than a certain cutoff frequency and attenuates signals with frequencies higher than the cutoff frequency. The amount of attenuation for each frequency depends on the filter design. High frequency input signals, such as may be handled by the ADC devices described herein, may be attenuated in an input feed-forward path employing a filter, particularly a passive filter, in accordance the present systems and methods. Thus, a cut-off frequency of filter 302 or 404 may be outside a passband selected to pass input signals U(s). For higher frequency inputs embodiments, antialiasing filter may be disposed in front of ADC 402 to attenuate those high frequency inputs.

FIG. 5 is a graph Total Harmonic Distortion (THD) 502 in the output of ten example typical input feed-forward delta-sigma ADC devices compared to THD 504 in output of ten example feed-forward delta-sigma ADC devices employing a feed-forward input filter G(s) in accordance with some embodiments of the present systems and methods. Therein, it can be seen that on average, a 10 dB improvement in THD of output 604 of feed-forward delta-sigma ADC devices is obtained by employing a (passive) filter in the feed-forward path of the feed-forward delta-sigma ADC.

Hence, as evidenced in FIG. 5, the present feed-forward delta-sigma ADC topology provides excellent distortion performance. In particular embodiments, the present systems and methods may provide distortion performance in a 24-bit delta-sigma ADC IC providing overall THD of −125 dBc. While such an input feed-forward delta-sigma ADC may primarily be targeted towards industrial applications, with the improved distortion performance, devices employing a delta-sigma ADC with an input feed-forward path having a filter in accordance with the present systems and methods may compete with and/or replace best-of-breed audio parts, as lower power alternatives.

Many modifications and other embodiments will come to mind to one skilled in the art to which this disclosure pertains having the benefit of the teachings presented in the foregoing descriptions, and the associated drawings. Therefore, it is to be understood that the techniques of this disclosure are not to be limited to the specific embodiments disclosed. Although specific terms are employed herein, they are used in a generic and descriptive sense only and not for purposes of limitation.

What is claimed is:

1. A method for reducing kickback in a discrete-time delta-sigma analog-to-digital converter (DT-DSADC) comprising:

filtering, by a continuous-time filter, an input signal at an input terminal of the DT-DSADC, the continuous-time filter disposed in a feed-forward path of the DT-DSADC, the feed-forward path extending from the input terminal to a feed-forward summing circuit disposed between a discrete-time loop filter and a quantizer of the DT-DSADC, and sampling, by a feed-forward sampler, the filtered input signal, the feed-forward sampler disposed after the continuous-time filter in the feed-forward path of the DT-DSADC, wherein the disposing of the continuous-time filter before the feed-forward sampler reduces kickback due to the sampling of the filtered input signal by the feed-forward sampler.

2. The method of claim 1, wherein the continuous-time filter filtering the input signal is a low pass filter.

3. The method of claim 2, wherein the low pass filter is a resistor-capacitor circuit.

4. The method of claim 1, wherein the continuous-time filter has a cut-off frequency outside of a passband of the DT-DSADC, the passband including a range of frequencies corresponding to input signals of the DT-DSADC.

5. The method of claim 1, wherein the discrete-time delta-sigma analog-to-digital converter is an integrated circuit.

6. A discrete-time delta-sigma analog-to-digital converter (DT-DSADC) comprising:

a continuous-time filter disposed in a feed-forward path of the DT-DSADC, the feed-forward path extending from an input terminal of the DT-DSADC to a feed-forward summing circuit disposed between a discrete-time loop filter and a quantizer of the DT-DSADC, the continuous-time filter configured to filter an input signal at the input terminal; and a feed-forward sampler disposed after the continuous-time filter in the feed-forward path of the DT-DSADC, the feed-forward sampler configured to receive the filtered input signal and to sample the filtered input signal, the continuous-time filter disposed before the feed-forward sampler for reducing kickback due to the sampling of the filtered input signal by the feed-forward sampler.

7. The discrete-time delta-sigma analog-to-digital converter of claim 6, wherein the discrete-time loop filter includes a cascade of integrators.

8. The discrete-time delta-sigma analog-to-digital converter of claim 6, wherein the continuous-time filter is a low pass filter.

9. The discrete-time delta-sigma analog-to-digital converter of claim 8, wherein the low pass filter is a resistor-capacitor circuit.

10. The discrete-time delta-sigma analog-to-digital converter (DT-DSADC) of claim 9, wherein the low pass filter has a cut-off frequency outside of a passband of the DT-DSADC, the passband including a range of frequencies corresponding to input signals of the DT-DSADC.

11. The discrete-time delta-sigma analog-to-digital converter (DT-DSADC) of claim 6, wherein the DT-DSADC is an integrated circuit.

* * * * *